United States Patent [19]

Eitrheim et al.

[11] Patent Number: 5,336,939

[45] Date of Patent: Aug. 9, 1994

[54] STABLE INTERNAL CLOCK GENERATION FOR AN INTEGRATED CIRCUIT

[75] Inventors: John K. Eitrheim; Richard B. Reis, both of Garland, Tex.

[73] Assignee: Cyrix Corporation, Richardson, Tex.

[21] Appl. No.: 880,550

[22] Filed: May 8, 1992

[51] Int. Cl.$^5$ .................. H03K 3/017; H03K 3/26
[52] U.S. Cl. .................. 307/269; 307/265; 307/271; 307/310; 307/529; 307/601; 328/20; 328/25; 328/111
[58] Field of Search ............ 307/269, 271, 529, 265, 307/310, 601; 328/20, 25, 111

[56] References Cited

U.S. PATENT DOCUMENTS

| | | | |
|---|---|---|---|
| 3,812,384 | 5/1974 | Skorup | 307/238 |
| 4,446,437 | 5/1984 | Rinaldi | 328/120 |
| 4,638,181 | 1/1987 | Deiss | 307/243 |
| 4,943,787 | 7/1990 | Swapp | 331/2 |
| 4,959,617 | 9/1990 | Martin | 328/133 |
| 4,965,524 | 10/1990 | Patchen | 328/72 |
| 4,985,640 | 1/1991 | Grochowski et al. | 307/269 |
| 5,095,280 | 3/1992 | Wunner et al. | 328/63 |
| 5,136,180 | 8/1992 | Caviasca et al. | 307/269 |
| 5,220,217 | 6/1993 | Scara et al. | 307/481 |

*Primary Examiner*—Margaret Rose Wambach
*Attorney, Agent, or Firm*—Vinson & Elkins

[57] ABSTRACT

An integrated circuit, such as a microprocessor or math co-processor, having a clock generator circuit for generating a high frequency internal clock signal based on an external input clock signal is disclosed. The clock generator circuit includes a programmable delay stage having fixed and variable portions. The fixed portion preferably includes a series of logic elements of various types (NOR, NAND, NOT, pass gates, etc.), selected to match the worst case clock phase delay and which match speed variations as a function of voltage, temperature or processing conditions. The variable portion of the delay stage selects a propagation delay by way of programmable elements (e.g., mask programmable); multiplexers may be included therein to allow selection of the delay in a test mode. The high frequency clock is generated by a circuit having a set input receiving the input clock signal and a reset input receiving the output of the programmable delay stage; as a result, the output clock signal duty cycle depends upon the propagation delay through the programmable delay stage, and not upon the duty cycle of the input clock signal. A frequency divider may also be provided to generate a lower frequency clock based on the input clock signal. In addition, the set and reset circuits may be disabled in a non-clock doubling mode, in which another frequency divider may be enabled for generating an output clock signal.

30 Claims, 4 Drawing Sheets

STABLE INTERNAL CLOCK GENERATION FOR AN INTEGRATED CIRCUIT

This application is related to our copending application Ser. No. 07/880,751, entitled "A Clock Generator Circuit with Selectable Modes", filed contemporaneously herewith and assigned to Cyrix Corporation.

This invention is in the field of integrated circuits, and more particularly is directed to internal clock distribution schemes in such circuits.

BACKGROUND OF THE INVENTION

Many modern integrated circuits are of the synchronous type, such that their internal operation is governed by an external clock signal. Examples of high density, high speed clocked logic circuits include microprocessors, microcomputers, math co-processors and the like; of course, other simpler circuits such as memories and smaller scale logic circuits may also be governed by external clock signals. Clock signals may be generated in systems using these circuits by way of a stand-alone crystal oscillator circuit, or by connection of a crystal to terminals of the clocked logic device itself in the case where the oscillator is integrated onto the same integrated circuit chip with the logic function.

As is well known in the art, the rate at which a clocked integrated circuit performs its function is generally highly dependent upon the frequency of the clock signal. Especially in digital circuits, this is because the internal chip functions are either directly or indirectly (via frequency dividers, phase-locked loops and the like) controlled by the received clock signal. As such, for the example of a microprocessor, the number of instructions performable by the circuit in a given period of time will vary with the frequency of the clock signal.

Particularly in complex clocked circuits such as microprocessors and math co-processors, the performance of certain circuit functions may depend on the clock frequency while the rate at which other functions are performed may be limited by other factors. For example, certain input/output functions may be limited by bus interface specifications rather than the clock frequency, while the speed of core or CPU functions will likely depend directly on the clock frequency. It is therefore beneficial in such circuits to provide high frequency clocks to certain portions of the circuit (e.g., the CPU or core of a microprocessor), with lower frequency clocks being provided to other portions (e.g., the bus interface). In the field of microprocessors, this desired result is generally referred to as "clock doubling", particularly in the case where the core clock is operating at twice the rate of the bus interface clocks.

A conventional circuit for deriving clock signals at various frequencies from an input clock signal is the combination of a phase-locked loop (PLL) and one or more frequency dividers. In this arrangement, the PLL provides stability in the generated output clock signals relative to the input clock, while the ratio of the frequency dividers in the output and feedback loops determines the relative frequency between the output clock signals and the input clock. However, a PLL circuit cannot instantaneously respond to a change in the input clock frequency, as several transition cycles may be necessary to lock onto a new input clock signal frequency. The ability to rapidly change the internal operating frequency has become important in recent years with the advent of "turbo" mode personal computers and workstations, in which a faster clock rate (e.g., 20 MHz instead of 8 MHz) is enabled by the user via a hardware switch. The transient cycles required for PLL circuits to lock onto a new frequency thus can cause erroneous system operation when turbo mode is selected or deselected.

In addition, PLL-based circuits are generally limited in operating power supply voltage range (primarily due to the operation of the voltage controlled oscillator), and as such are not well-suited for use in circuits that are to operate over a wide power supply voltage range. As modern fabrication technology continues to reduce physical feature sizes such as transistor channel lengths to well below one micron, it is contemplated the use of lower power supply voltages (e.g., 3.3 volts) will become more prevalent in order to avoid reliability problems, such as the hot electron effect. It will therefore become increasingly important for large scale integrated circuits to be able to operate at lower power supply voltages, and perhaps over a range including both the conventional 5 volt power supply voltage and the lower 3.3 volt power supply voltage.

Another known technique for providing different clock frequencies to different circuit portions is to have two terminals for receiving input clocks at different frequencies. In this technique, for example as used in the Intel 80387 math co-processor, the state of another terminal (either hardwired externally or connected in the wiring of an on-chip bond pad) selects whether the clock signal received at the alternate clock terminal is to be ignored or used.

Certain other clock doubling schemes have considered the use of internal frequency dividers to divide down the input clock frequency prior to application to slower circuit functions. For example, it is known to use a half-frequency clock (relative to the input clock frequency) to control the bus interface of a microprocessor circuit. In such arrangements, the frequency divider not only reduces the clock frequency, but also corrects for variations in duty cycle and ringing conditions on the input clock signal. While such correction for input clock instabilities may be performed prior to use in slower circuit functions, these instabilities preclude the direct use of the input clock signal for the high speed circuit functions in the CPU or core. In particular, certain phases of the input clock signal may be too short (especially when unstable) to allow for completion of certain internal core functions.

Furthermore, in the art of internal clock distribution for integrated circuits such as microprocessors and the like, the optimization of duty cycle for internal clocks generated from externally received clock signals has heretofore generally been quite difficult. This is due to the constraints presented by the expected variations of the duty cycle of the external clock, as indicated in various timing specifications; furthermore, as microprocessor clock frequencies increase to 25 MHz and beyond, external clock signals are more susceptible to ringing and other noise effects that increase with faster switching times, resulting in less well defined and controlled clock phases. As such, the generation of internal clock signals from an external clock signal, particularly for high frequency operation, has heretofore required the designer to make tradeoffs in selecting the duration of each phase in the internal clock signals.

It is therefore an object of the present invention to provide an internal clock generation scheme which generates high speed internal clocks at steady duty cycles and lower speed clocks for lower speed circuit functions.

It is a further object of the present invention to provide such a scheme in which the duty cycle of the high speed clock is optimized for the worst case clock phase operation of the integrated circuit.

It is a further object of the present invention to provide such a scheme in which the duty cycle of the high speed clock may be characterized and easily adjusted.

It is a further object of the present invention to provide such a scheme which has a high degree of power supply voltage stability, enabling low voltage operation of the circuit.

It is a further object of the present invention to provide such a scheme in which the generation of the clock may be switched between a clock doubling mode and a non-clock doubling mode.

It is a further object of the present invention to provide such a scheme in which the mode selection may be readily made during the manufacturing process.

Other objects and advantages of the present invention will become apparent to those of ordinary skill in the art having reference to the following specification in conjunction with the drawings.

SUMMARY OF THE INVENTION

The invention may be incorporated into an integrated circuit having a clock generator circuit that receives an input clock signal and generates an output clock signal based upon one edge thereof. The clock generator circuit includes a delay period selected according to the worst case delay path for one of the clock phases; this delay period determines the duty cycle of the internally generated clock in a manner which is independent from that of the input clock signal. In the preferred embodiment, the delay period is generated by a delay stage having a fixed portion and a variable portion; the fixed portion includes gate delays of various types so that process, voltage and temperature variations in the integrated circuit and its operation are matched by changes in the delay stages. The variable portion of the delay stage facilitates characterization and adjustment of the delay period.

DETAILED DESCRIPTION OF THE PREFERRED EMBODIMENTS

Figure 1:
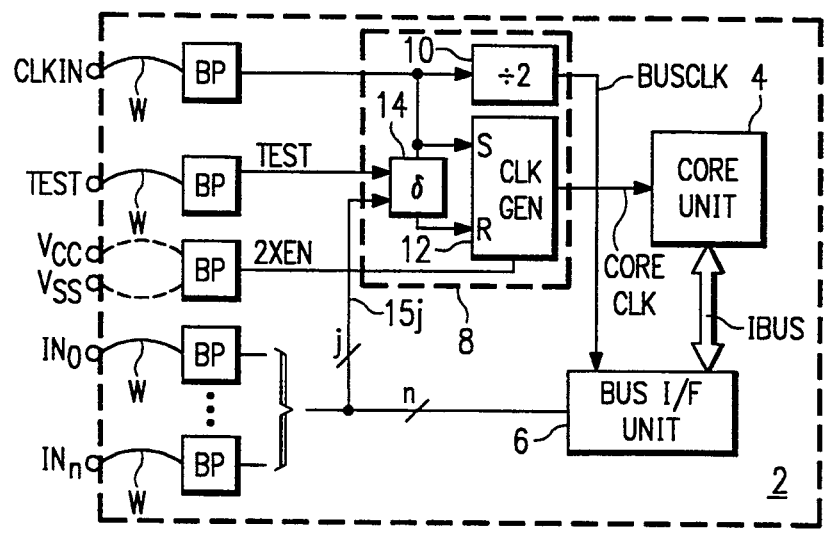
FIG. 1 is an electrical diagram, in block form, of an integrated circuit incorporating the preferred embodiment of the invention.

Referring first to FIG. 1, the construction of integrated circuit 2, such as a microprocessor, math coprocessor or the like having at least two different functions which can operate at different clock frequencies, and thus in which the preferred embodiment of the invention is implemented will be described. In this example, integrated circuit 2 includes a core unit 4 which performs a sequence of instructions or some other complex logic operation, preferably at the fastest possible clock frequency to optimize circuit performance. Integrated circuit 2 further includes bus interface unit 6 which is in communication with input and output terminals (not shown) of integrated circuit 2, and is also in communication with core unit 4 by way of internal bus IBUS. Bus interface unit 6 is intended to receive input signals presented at address and data input terminals, to control the operation of core unit 4 and other functions in integrated circuit 2, and also to control the presentation of output data at output terminals; since the timing requirements of bus interface unit 6 are governed by the input/output specifications of other integrated circuits in the system, it may require a slower clock frequency than that usable by core unit 4.

For reference hereinbelow, certain of the input terminals to integrated circuit 2 are illustrated in FIG. 1 as being connected to circuitry via a bond wire W and a bond pad BP. Other inputs and outputs are, of course, similarly connected but are not shown in FIG. 1 for purposes of clarity. The illustration of the bond pads BP in FIG. 1 will become apparent relative to the optional wire bonding of one of the bond pads BP discussed hereinbelow. In addition, conventional input buffer circuits may also be provided within integrated circuit 2 in the conventional manner; such buffers are also not illustrated in FIG. 1 for purposes of clarity.

In the example of FIG. 1, integrated circuit 2 is operable to receive an input clock signal at terminal CLKIN. The input clock signal may be an externally generated periodic clock, such as from an external oscillator, or alternatively the input clock signal may be generated on-chip based on a crystal connected to terminal CLKIN that determines the clock frequency. Clock control circuit 8 presents to core unit 4 (on line CORECLK) an internal clock signal at the same frequency as the input clock signal at terminal CLKIN, and presents to bus interface unit 6 (on line BUSCLK) an internal clock signal at one-half the frequency of the input clock signal received at terminal CLKIN. The half-frequency clock signal is generated and applied to line BUSCLK by frequency divider 10, which in this case divides the input clock signal frequency by two prior to its presentation on line BUSCLK.

According to the preferred embodiment of the invention, clock control circuit 8 further includes clock generator 12 which receives the input clock signal from terminal CLKIN at a "set" input, and which receives the input clock signal from terminal CLKIN, delayed by programmable delay stage 14, at a "reset" input. Programmable delay stage 14 in this embodiment of the invention includes a default delay value that is enabled for normal (non-test mode) operation, implemented within programmable delay stage 14 by the metallization pattern or by way of fusible links or other programmable elements (FAMOS transistors, etc.). In addition, programmable delay stage 14 also receives a test input from terminal TEST and j select lines $15_j$ from selected input terminals $IN_0$ through $IN_n$ so that, in a special test mode selected by the logic state applied to terminal TEST, the j select lines $15_j$ can select a portion of the delay period through delay stage 14.

Programmable delay stage 14 and clock generator 12 each also receive an input on line 2XEN indicating if the clock doubling mode is to be enabled; when enabled, the clock doubling mode causes the core unit clock frequency on line CORECLK to be twice that of the bus clock frequency on line BUSCLK. In this example, selection of the clock doubling feature is made at the wire bonding step of the manufacturing process, by connecting the bond pad BP associated with line 2XEN to be connected to the $V_{cc}$ power supply terminal (which, in this example, enables clock doubling) or to the $V_{ss}$ or ground terminal (disabling clock doubling).

As will be described hereinbelow, clock control circuit 8 according to this embodiment of the invention is controlled by the state of line 2XEN, so that the clock signal on line CORECLK may be generated either in a clock doubling mode or in a non-clock doubling mode. In addition, interface circuitry controlling the communication of data on internal bus IBUS is also preferably controlled according to the state of line 2XEN, so that communication between core unit 4 and bus interface unit 6 can be performed according to the selected internal clock relationship. It is contemplated that the construction of such interface circuitry will be apparent to one of ordinary skill in the art having reference to this specification.

In the general sense, clock generator 12 operates in the clock doubling mode to respond to one of the input clock signal edges; for purposes of this description, the term "rising edge" will refer to a low-to-high transition for a signal, and the term "falling edge" will refer to a high-to-low transition. In the example of FIG. 1, the rising edge of the input clock signal sets the output of clock generator 12 (on line CORECLK) to a high level. Clock generator 12 resets low its output on line CORECLK responsive to receiving the rising edge of the input clock signal, delayed by the time delay set within programmable delay stage 14. The delay period of programmable delay stage 14 is preferably selected to slightly exceed the time required for the worst case clock phase in the instruction set or possible operations of core unit 4. As such, clock generator 12 uses edge triggered set and reset functions based on the input clock signal, and provides an internal clock signal on line CORECLK that is at the same frequency as the input clock signal at terminal CLKIN, at a fixed phase duration so that variations in the duty cycle of the input clock signal thus do not affect the duty cycle of the internal clock signal on line CORECLK. In the preferred embodiment of the invention, the delay period is selected according to the propagation delay of the worst case logic path, thus ensuring proper operation of integrated circuit 2 regardless of the duty cycle of the input clock signal, and thus over a wide range of duty cycle timing specifications.

Meanwhile, frequency divider 10 is generating a clock signal on line BUSCLK that is at half the frequency of the input clock signal at terminal CLKIN. Accordingly, the operation of bus interface unit 6 can be controlled in a manner consistent with externally connected integrated circuits, while still allowing the operation of core unit 4 to perform at the highest practicable clock rate.

Figure 2:
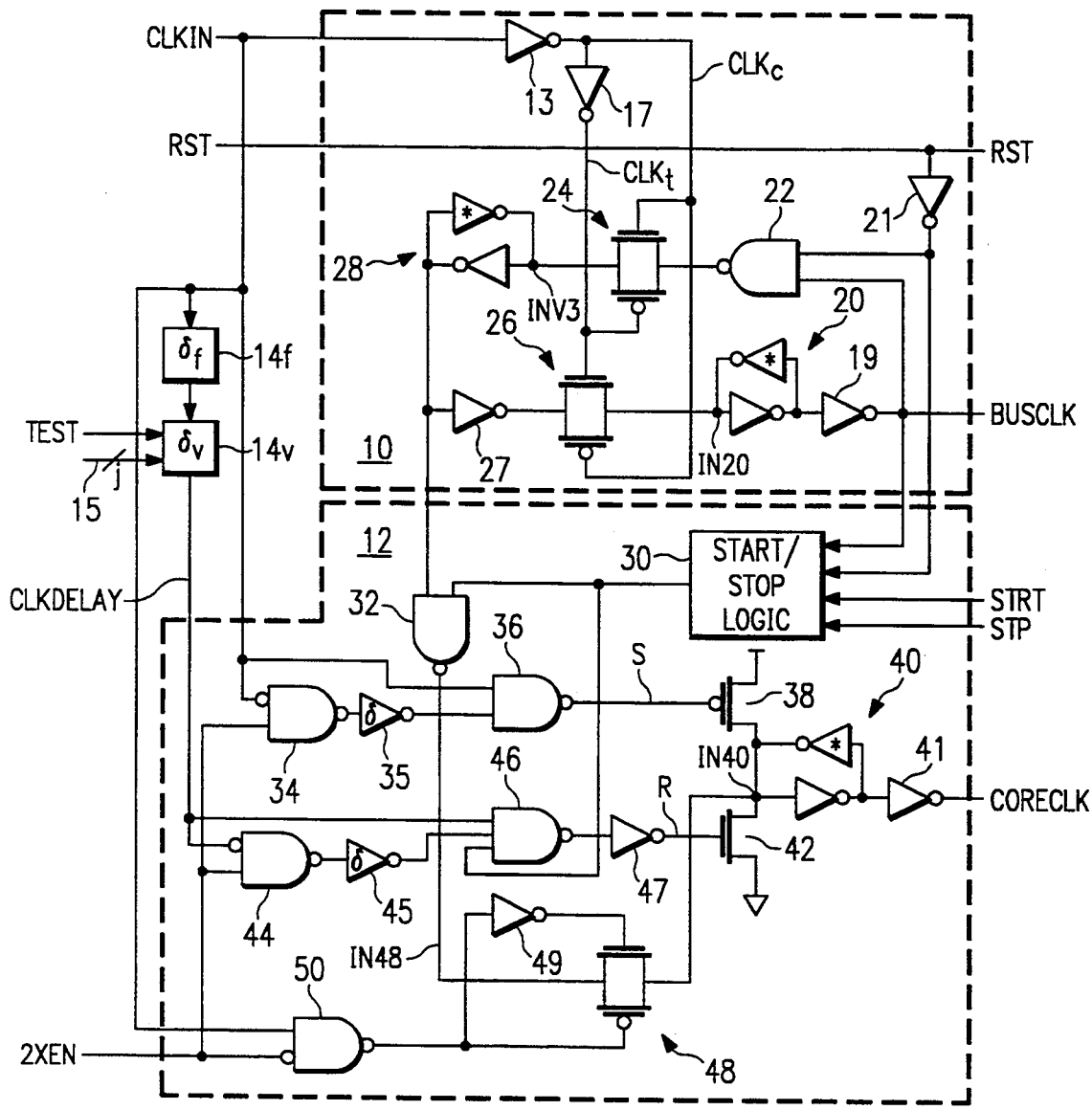
FIG. 2 is an electrical diagram, in schematic form, of the clock generator circuit according to the preferred embodiment of the invention.

Referring now to FIG. 2, the construction of frequency divider 10 and clock generator 12 according to the preferred embodiment of the invention will now be described in detail.

Frequency divider 10 in this example of the invention is of substantially conventional design, and includes a reset function by which its output may be suspended. Line CLKIN communicates the input clock signal (after buffering if desired) to inverters 13 and 17, which generate complement and true clock signals on lines CLKc and CLKt, respectively. Each of pass gates 24, 26 consist of complementary MOS transistors having their source/drain paths connected in parallel with one another, and having their gates connected to complementary lines CLKt, CLKc so as to be simultaneously on or off.

Line RST communicates a reset signal from elsewhere in integrated circuit 2 to an input of NAND gate 22 in frequency divider 10 and to start/stop logic 30 in clock generator 12. Line RST is preferably buffered within integrated circuit 2, in the conventional manner, to eliminate false resets due to noise, and to ensure proper phase synchronization after reset. The second input of NAND gate 22 is connected to the output of frequency divider 10 on line BUSCLK. During non-reset modes, the low logic level on line RST presents a high logic level (via inverter 21) to one input of NAND gate 22, allowing the state of line BUSCLK to control the output of NAND gate 22.

The output of NAND gate 22 is connected to one side of pass gate 24. The other side of pass gate 24 is received by latch 28 and communicated to one side of pass gate 26 (after inversion by inverter 27 to account for the inversion by latch 28). Latch 28, in this example and elsewhere within this embodiment of the invention, consists of a pair of cross-coupled inverters where the feedback inverter has significantly weaker drive than the feed-forward inverter so that it can be rapidly overwritten as a new logic level is received at its input; this weaker drive is illustrated in FIG. 2 by an asterisk in the feedback inverter of latch 28 (and in other latches in FIGS. 2 and 3).

In this example, pass gate 24 is operable to pass the state of the output of NAND 22 to latch 28 during the low level phase of the input clock signal on line CLKIN. Accordingly, if line RST is low during this phase, the logical complement of the state of line BUSCLK is communicated to latch 28 during low phases of the input clock signal. After inversion by inverter 27, the state of latch 28 is communicated to pass gate 26.

Pass gate 26 has its other side connected to latch 20 which, via inverter 19, drives line BUSCLK. In this example, pass gate 26 has its gates controlled by lines CLKt, CLKc in a complementary manner relative to pass gate 24, such that pass gate 26 is conductive during high level phases of the input clock signal at line CLKIN. Accordingly, the complement of the state of line BUSCLK thus requires both a low level phase and a high level phase to be communicated back to latch 20, for presentation (after inversion by inverter 19) on line BUSCLK as a logic level transition of this output clock. As such, the frequency at which line BUSCLK toggles will be exactly one-half that of the input clock signal at line CLKIN.

As noted above, when line RST is at a low logic level, NAND gate 22 is operable to respond to the state of line BUSCLK; conversely, in a reset or suspend operation, where line RST is at a high logic level, the output of NAND gate 22 is forced high regardless of the state of line BUSCLK. Accordingly, the state of line BUSCLK is held high during the reset condition.

Start/stop logic receives line RST (via inverter 21), line BUSCLK, and start and stop signals on lines STRT and STP, respectively. Start/stop logic 30 includes such combinational logic as required to enable and disable clock generator 12 according to the reset condition on line RST, and according to the start and stop signals. The start and stop signals allow for suspension of the output clock signal on line CORECLK, as will be described hereinbelow.

The input clock signal at line CLKIN is communicated to an inverting input of NAND gate 34 and to a non-inverting input of NAND gate 36. The second input of NAND gate 34 receives line 2XEN which enables clock doubling with a high logic level. The output of NAND gate 34 is communicated, via inverting delay stage 35, to the second input of NAND gate 36. Delay stage 35 may consist of several inverters in series, of a conventional single delay stage, or other conventional delay circuits for delaying the propagation of the signal from the output of NAND gate 34 to the input of NAND gate 36 for a selected time. As a result, NAND gate 36 will present a low logic level pulse responsive to the rising edge of the input clock signal at line CLKIN, and having a pulse width corresponding to the propagation delay of NAND gate 34 and delay stage 35. The output of NAND gate 36 is connected to the gate of a p-channel transistor having its source-drain path connected between $V_{cc}$ and the input of latch 40; the output of latch 40 drives line CORECLK via inverter 41.

The input clock signal on line CLKIN is also connected to fixed delay stage 14f and variable delay stage 14v, connected in series. In this example, and as will be described in further detail hereinbelow, variable delay stage 14v receives inputs on line TEST and on j select lines 15j, as shown in FIG. 1. The output of variable delay stage 14v on line CLKDELAY is connected to a non-inverting input of NAND gate 46 and to an inverting input of NAND gate 44. The second input of NAND gate 44 receives line 2XEN. As in the above-described case, the output of NAND gate 44 is connected to a second input of NAND gate 46 via inverting delay stage 45. As a result, the output of NAND gate 46 will present a low logic level pulse responsive to the rising edge of the signal on line CLKDELAY from variable delay stage 14v, having a pulse width defined by the delay through NAND gate 44 and delay stage 45. The output of NAND gate 46 is connected, after inversion by inverter 47, to the gate of an n-channel transistor 42 having its source/drain path connected between the input of latch 40 and ground.

NAND gate 46 also receives an input from the output of start/stop logic 30, thus allowing the reset signal on line RST, and the start and stop signals on lines STRT and STP, to control the operation of clock generator 12 in the clock doubling mode. For example, if start/stop logic 30 drives a low logic level at its output, the output of NAND gate 46 will be forced high, ensuring that n-channel transistor 42 does not turn on. In such an event, latch 40 cannot be overwritten with a low level, thus disabling transitions of the clock signal on line CORECLK.

Line 2XEN is also connected to an inverting input of NAND gate 50, which receives the input clock signal on line CLKIN at its other input. The output of NAND gate 50 is connected to pass gate 48 in complementary fashion (via inverter 49); as such, pass gate 48 is made non-conductive when line 2XEN is high, during the clock doubling mode.

Clock generator 12 according to this example also can provide a half-frequency clock signal on line CORECLK during the non-clock doubling mode indicated by line 2XEN being at a low logic level. NAND gate 32 receives the output of latch 28 in frequency divider 10 at one input, and receives the output of start/stop logic 30 at the other input. Start/stop logic 30 is therefore able to gate the application of the output of latch 28 to the frequency divider portion of clock generator 12, such as is useful in suspending its operation (as in the case of line RST being high for frequency divider 10) and restarting it in a synchronous manner.

The output of NAND gate 32 is presented to one side of pass gate 48. The opposite side of pass gate 48 is coupled to the input of latch 40. Considering the effect of NAND gate 50 and inverter 49, the n-channel transistor in pass gate 48 receives a signal corresponding to the input clock signal on line CLKIN, and the p-channel transistor in pass gate 48 receives a signal corresponding to the logical complement of the input clock signal on line CLKIN; as such, pass gate 48 is gated similarly as pass gate 26 in frequency divider 10. As a result, in non-clock doubling mode, clock generator 12 is configured similarly as frequency divider 10 (with the two circuits sharing the first portion thereof of NAND gate 22, pass gate 24 and latch 28), for generating a half-frequency clock on line CORECLK. In this mode, therefore, the frequency of the clock signal on lines CORECLK and BUSCLK are identical.

Figure 4A:
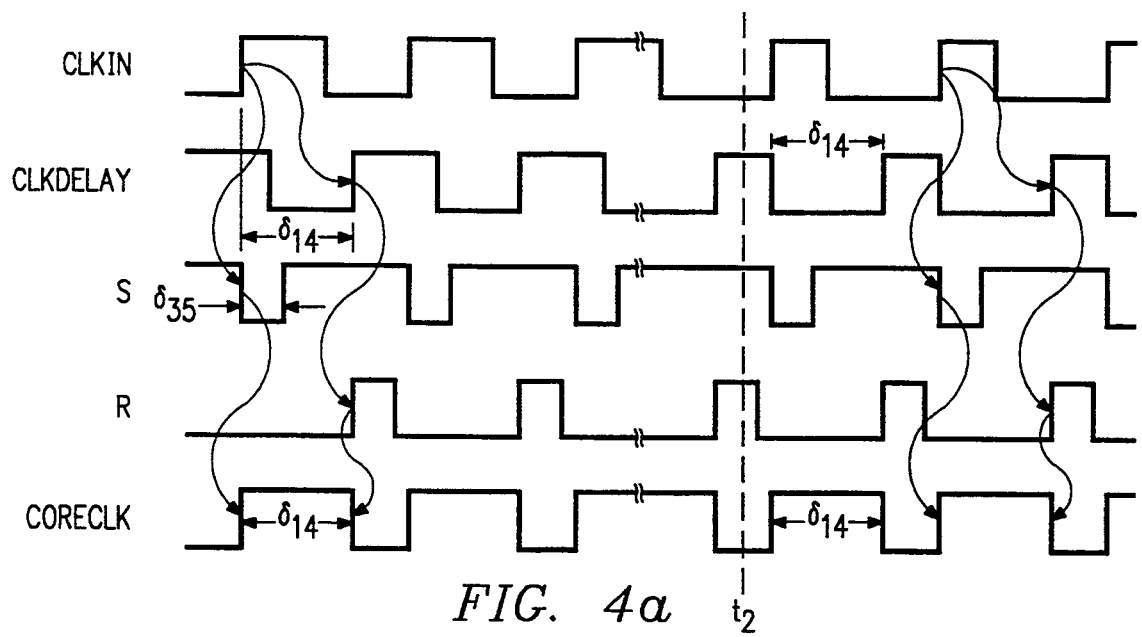
FIGS. 4a and 4b are timing diagrams illustrating the operation of the clock generator circuit according to the preferred embodiment of the invention.

FIG. 4a illustrates the operation of clock generator 12 in clock doubling mode, selected by line 2XEN being at a high logic level. For purposes of clarity of description, small propagation delays and charging transients are not shown in FIG. 4a. In this mode, a rising edge on line CLKIN first causes the output of NAND gate 36 (node S in FIG. 4a) to go to a low logic level. This low logic level at the output of NAND gate 36 continues until the rising edge propagates through NAND gate 34 and delay stage 35; this propagation delay is shown in FIG. 4a as δ35, and defines the pulse width of the low logic level at node S. Responsive to node S being low, transistor 38 turns on, charging the input of latch 40 high which, via inverter 41, drives line CORECLK high. Accordingly, in clock doubling mode the rising edge of the input clock signal operates to set the output of clock generator circuit 12 on line CORECLK.

The rising edge of the input clock signal at line CLKIN also propagates through delay stages 14f, 14v, appearing at line CLKDELAY after the delay period $δ_{14}$ (i.e., the propagation delay through delay stages 14f, 14v). At such time as the rising edge of the input clock signal appears on line CLKDELAY, the output of NAND gate 46 goes to a low logic level (the other inputs to NAND gate 46 being high). The low logic level at the output of NAND gate 46, via inverter 47, drives the gate of n-channel transistor 42 (node R of FIGS. 2 and 4a) high, turning on transistor 42 and discharging the input of latch 40 to ground. Latch 40 and inverter 41, in turn, drive line CORECLK low in response to transistor 42 being turned on. Accordingly, the rising edge of the signal on line CLKDELAY operates to reset the output of clock generator 12 on line CORECLK to a low level, delayed from the high level transition by the delay time $\delta_{14}$ of programmable delay stage 14.

It should be apparent to one of ordinary skill in the art that the duration of the pulse width of the low logic level pulse at node S (i.e., the time delay $\delta_{35}$) and the duration of the high logic level pulse at node R (i.e., the time delay $\delta_{45}$) should be selected to ensure that the input to latch 40 is fully charged and discharged, respectively, in each cycle. However, these delays should also be selected to prevent the set and reset pulses from overlapping, as such would cause a crowbar condition (i.e., direct short from $V_{cc}$ to ground) through transistors 38 and 42.

As a result of the operation of clock generator 12, a clock signal is generated on line CORECLK which is at the same frequency as the input clock signal, but which has a duty cycle independent from that of the input clock signal. This is because the duration of one of the phases of the clock on line CORECLK is dependent upon the time between the set and reset pulses (at low and high levels, respectively, in this example). According to this embodiment of the invention, the time between the set and reset pulses depends solely upon the delay period $\delta_{14}$ through programmable delay 14 (i.e., through delay stages 14f, 14v), and does not depend upon the duty cycle of the input clock signal on line CLKIN. Indeed, in the example of FIG. 4a, it should be noted that the duration of the high level phase on line CORECLK is greater than that of the input clock signal on line CLKIN. As will be discussed in further detail hereinbelow, this allows the duty cycle of the internal high frequency clock on line CORECLK to be optimized for the worst case phase, rather than for an average which is dependent upon the input clock signal.

This independence of the duty cycle of the clock signal on line CORECLK is further evident from the later cycles (after time $t_2$) shown in FIG. 4a. In these cycles, the duty cycle of the input clock signal on line CLKIN after time $t_2$ has become shorter than in the previous cycles illustrated in FIG. 4a, to approximately half that of the desired duration on line CORECLK. As in the prior cycles, however, the rising edge of the signal on line CLKIN causes a low logic level pulse at node S which, in turn, drives line CORECLK high. After expiration of the delay period $\delta_{14}$ after this edge, line CLKDELAY presents a rising edge which causes node R to be driven high, driving line CORECLK low. As a result, the duty cycle of the clock signal on line CORECLK remains constant, as determined by the delay time $\delta_{14}$ of programmable delay stage 14, and is thus independent of the duty cycle of the input clock signal on line CLKIN.

This construction of clock generator 12 thus provides a high degree of stability in the generation of a high frequency internal clock based on a received high frequency input clock signal. Particularly as microprocessor clock frequencies increase to 25 MHz and beyond, the generation and presentation of external clock signals of high quality and stability becomes more difficult, especially considering ringing and other noise effects which become more pronounced with higher switching speeds. Since clock generator 12 according to this embodiment of the invention generates its clock signals based on edges of the input clock signal, and on internal delays, the clock signal on line CORECLK is not strongly affected by noise and other instabilities in the input clock signal.

Figure 4B:
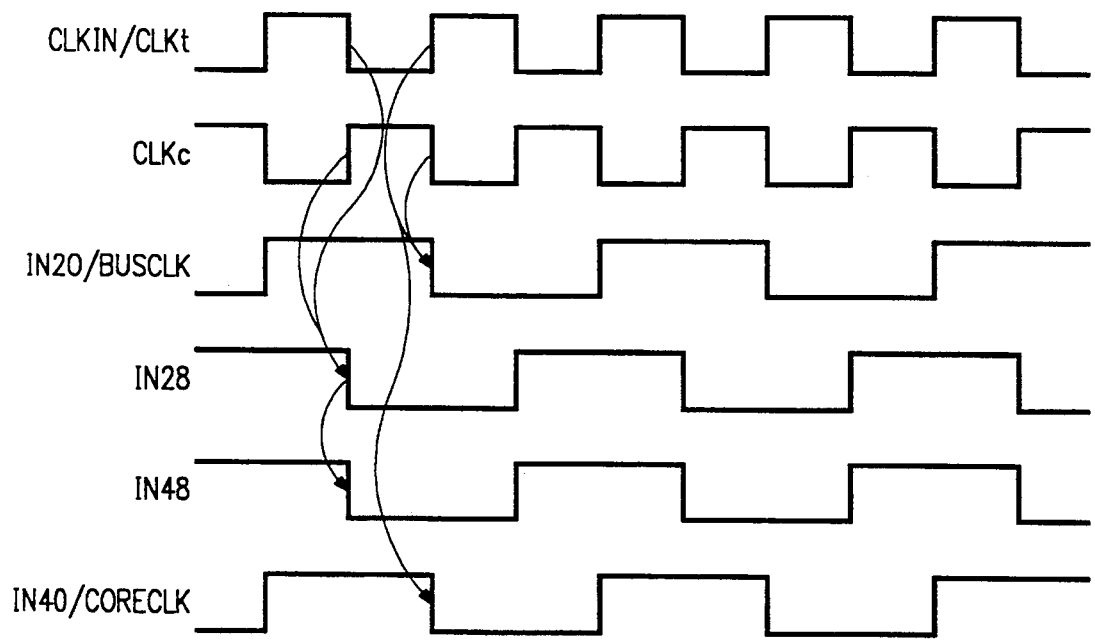

Referring next to FIG. 4b, the operation of clock generator 12 in the non-clock doubling mode, indicated by line 2XEN being at a low logic level, will now be described. With line 2XEN at a low logic level, the outputs of NAND gates 34 and 44 are both forced high, causing transistors 38 and 42 to both be held in the off condition in this mode. The low logic level on line 2XEN also enables NAND gate 50 to respond to the input clock signal on line CLKIN, so that pass gate 48 receives complementary gating signals corresponding to line CLKIN.

The cycles illustrated in FIG. 4b begin with the initial condition of line BUSCLK (and thus node IN20 at the input of latch 20) at a high logic level, and line CORECLK (and thus node IN40 at the input of latch 40) at a high logic level. Upon the falling edge of line CLKIN (corresponding to a rising edge on line CLKc and a falling edge on line CLKt), pass gate 24 is made conductive, communicating the state of line BUSCLK, inverted by NAND 22, as a low logic level to node IN28 at the input to latch 28. This low logic level is also communicated via NAND gate 32 (the output of start/stop logic 30 being high to enable operation) as a low level (inverted twice by latch 28 and NAND gate 32) to node IN48 at the input to pass gate 48. Pass gates 26 and 48 are non-conductive during this phase of the input clock signal, as they are gated in a complementary fashion relative to pass gate 24.

Upon the rising edge of the input clock signal, pass gates 26 and 48 become conductive and pass gate 24 turns off. Latch 28 retains its low logic level input at this time due to the operation of its feedback inverter. With pass gate 26 conductive, the state of node IN28 is communicated (after inversion by latch 28 and by inverter 27) to node IN20 at the input of latch 20, thus presenting a low logic level on line BUSCLK. Similarly, with pass gate 48 conductive, the low logic level at node IN48 is communicated to the input of latch 40 (node IN40), and presented on line CORECLK.

This operation of frequency divider 10 and clock generator 12 in the non-clock doubling mode continues, with the alternating state of line BUSCLK fed back through NAND gate 22 into frequency divider 10. As a result, in this mode the frequencies of the signals on lines BUSCLK and CORECLK are equal to each other, at half the frequency of the input clock signal frequency at line CLKIN.

As noted hereinabove relative to FIG. 4a, the propagation delays through this circuit are not illustrated in FIG. 4b, for clarity of description. However, for purposes of stability, it may be preferable to insert delay stages, such as inverter chains, at certain locations in the circuit, thus ensuring that a logic transition is not occurring at the input to a pass gate at the same time as the pass gate turns off. For example, inverter 27 may be replaced by a series of inverters, with propagation delay therethrough as desired.

In addition, clock generator 12 may be readily configured to provide a complementary clock signal to the signal on line CORECLK, for example by providing a similar circuit to that of latch 40 and transistors 38, 42, 48, but which operates in complementary fashion. It is contemplated that other clock signals may be generated from those signals shown in FIG. 2 by the addition of such elementary logic as would be known by one of ordinary skill in the art having reference to this description.

According to this embodiment of the invention, the ability of clock control circuit 8 to selectably operate in either the clock doubling mode or non-clock doubling mode, depending upon the state of line 2XEN, provides significant advantages in the design and operation of integrated circuit 2 over prior techniques. According to prior techniques, a control signal selected, for certain integrated circuit functions (such as the core unit and the bus interface unit), which of the clock signals was to control their operation; as such, the functional circuitry necessarily required relatively complex circuitry to implement this ability to respond to a selected clock signal, with such circuitry necessarily affecting the most critical timing path of the high frequency internal clocks. According to the present invention, however, the ability of clock control circuit 8 to generate output clock signals in a selected mode allows the functional circuitry, such as core unit 4, to be designed so that it need only respond to a single internal clock signal, as the determination of the core clock frequency is made by clock control circuit 8.

As noted above, the selection of which clock mode is made, in this example, by the bonding of pad 2XEN to a power supply or ground pad. This method of selecting the clock mode is especially beneficial to the manufacturer, as only a single type of integrated circuit 2 need be fabricated in order to provide inventory for both types of products (clock doubled or not), as the selection of the operation mode need not be made at the initial wafer fabrication stage, but instead is determined in the packaging operation. Furthermore, the user of integrated circuit 2 according to this embodiment of the invention is not required to make any provision, such as externally connecting a terminal high or low, in order to maintain the proper desired operating mode.

Referring back to the clock doubling mode of FIG. 4a, clock generator 12 according to the present invention thus generates an internal clock signal having a duty cycle which depends upon a delay time $\delta_{14}$ through programmable delay stage 14. In modern high complexity integrated circuits such as microprocessors and math co-processors, one of the two clock phases will control the worst case logic propagation path, such that the duration of the worst case phase will be critical in the operation of the circuit (i.e., if the duration of this worst case clock phase is too short, the circuit will malfunction). According to the preferred embodiment of the invention, and as shown in FIG. 2, programmable delay stage 14 preferably includes a fixed delay stage 14f and a variable delay stage 14v, such that the delay time $\delta_{14}$, and thus the duration of the worst case clock phase, may be set or altered either during characterization, production test or in operation.

In setting delay time $\delta_{14}$, the circuit designer should consider, by way of modeling or other characterization, the worst case high speed logic path in core unit 4 for a possible instruction or logic operation, and add to the time required for this worst case path ($t_d$) a certain safety margin time ($t_m$) to arrive at a minimum clock phase duration ($t_h = t_d + t_m$), which will correspond to the delay time $\delta_{14}$. In order to ensure compliance over the full specification range of the circuit, it would be preferable that the ratio $t_d/t_h$ remain substantially constant over voltage, temperature, and processing conditions. In particular, it is desirable that integrated circuits such as microprocessors, math co-processors and the like be able to operate over a wide voltage range, including not only traditional levels of the $V_{cc}$ power supply voltage (i.e., nominally 5 volts) but also the lower $V_{cc}$ levels (i.e., nominally 3.3 volts) that are expected to be necessary for modern integrated circuits having sub-micron physical features.

Figure 3:
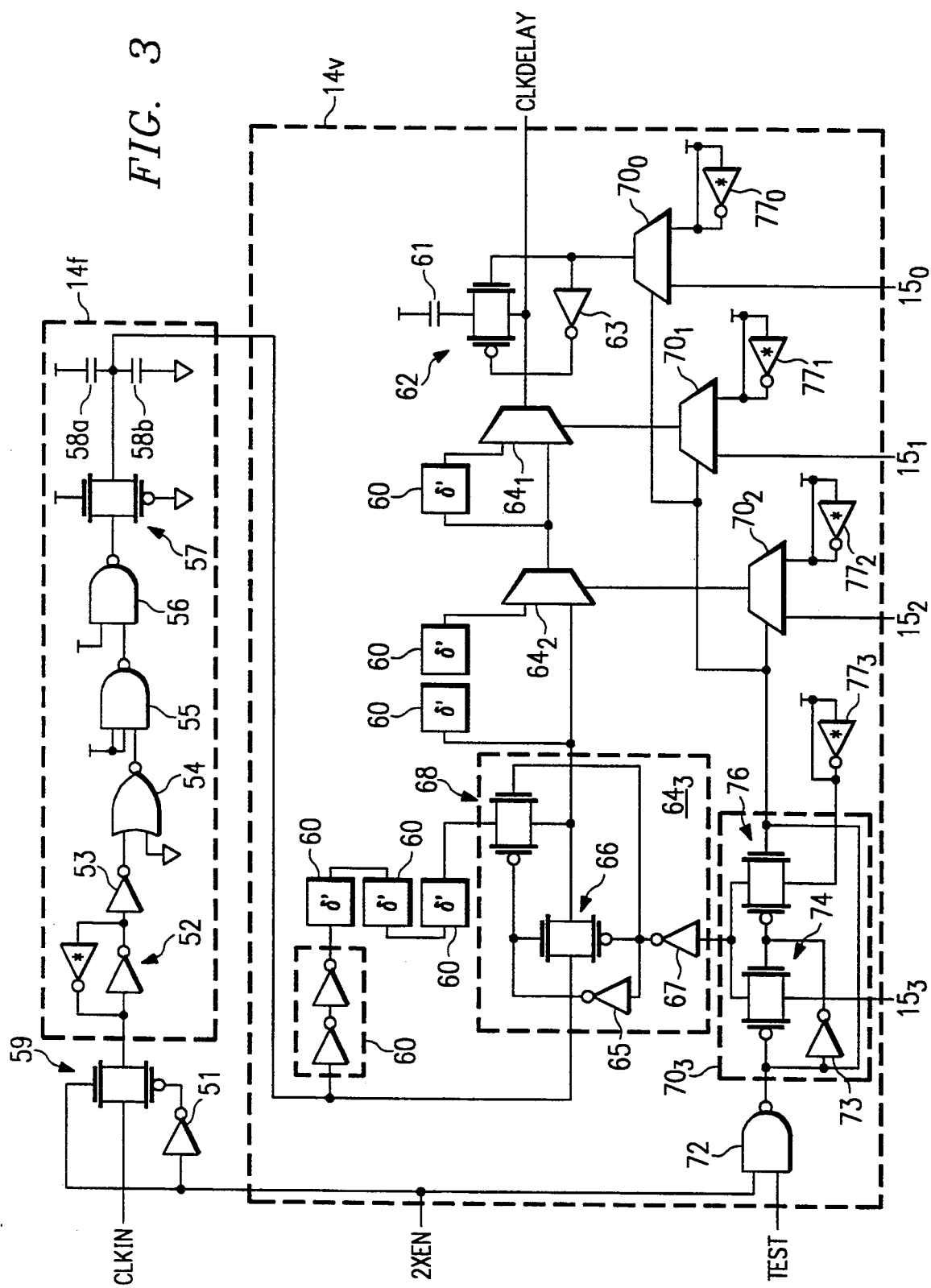
FIG. 3 is an electrical diagram, in schematic form, of the delay stage in the clock generator circuit of FIG. 2.

Referring now to FIG. 3, the construction of programmable delay stage 14 according to the preferred embodiment of the invention will now be described. This construction of programmable delay stage 14 includes such features as to provide a delay time $\delta_{14}$ that matches variations in voltage, temperature and processing which affect the minimum clock phase duration time $t_h$, and to provide the ability to readily change the delay time $\delta_{14}$ as necessary.

Fixed delay stage 14f receives the input clock signal on line CLKIN via pass gate 59, controlled in complementary fashion by the signal on line 2XEN. In non-clock doubling mode (since the clock signal on line CLKDELAY is not used; see FIGS. 3 and 4b) with line 2XEN low, pass gate 59 is non-conductive; during clock doubling mode, pass gate 59 remains conductive. Fixed delay stage 14f, according to this embodiment of the invention, includes multiple delay elements of various logic types, selected according to the worst case propagation delay in core unit 4 or elsewhere in circuit 2. The use of multiple types of delay elements, rather than many delay elements of the same type (e.g., a string of inverters), provides a high degree of matching of the delay through fixed delay stage 14f to variations of the worst case logic path resulting from changes in temperature, processing, and bias voltage, thus accounting for variations in the propagation delay among various types of circuit elements as a function of voltage, temperature, and process parameters. In this embodiment of the invention, fixed delay stage 14f includes latch 52, inverter 53, NOR gate 54 (with another input tied to ground), three-input NAND gate 55 (with its two other inputs tied high), two-input NAND gate 56 (with its other input tied high), pass gate 57 (biased on), and capacitors 58a, 58b biased to $V_{cc}$ and ground, respectively. Capacitors 58a, 58b represent parasitic capacitances in core unit 4, and may be implemented as separate capacitors in fixed delay stage 14f, or by way of parasitic capacitances therein. While one of each type of delay element is illustrated in FIG. 3, fixed delay stage 14f may include multiple ones of these elements, multiple chains of elements, or such other elements and combinations as useful to mimic the worst case core unit 4 delay path.

Variable delay stage 14v, according to this embodiment of the invention, receives the output of fixed delay stage 14f, and adds a selectable amount of delay thereto, prior to presenting the result at its output on line CLKDELAY. Variable delay stage 14v in this embodiment of the invention can select various delays in a special test mode, with a default delay set by way of metal mask options. In addition, as will be evident from the following description, the selection of the delay through variable delay stage 14v may be made in substantially equal increments by a binary code, thus allowing great flexibility in the selection of the overall delay time $\delta_{14}$.

In this example, variable delay stage 14v includes four individually selectable delay paths. The most significant delay path is a set of four inverter pairs 60 selectable by multiplexer $64_3$. Similarly, the next most significant delay path has two inverter pairs 60 selectable by multiplexer $64_2$; with the next most significant delay path having one inverter pair 60 selectable by multiplexer $64_1$. Each of the inverter pairs 60 preferably has the same propagation delay therethrough (i.e., delay $\delta'$). The least significant delay path is implemented by the connection of capacitor 61 by pass gate 62, adding a capacitive load which preferably matches one-half the delay $\delta'$ of an inverter pair 60, or the propagation delay of a single inverter. Accordingly, the delay time through variable delay stage 14ν may be selected in a binary fashion, as the four selectable paths are weighted in a binary fashion ($2^3$, $2^2$, $2^1$, and $2^0$ inverters, respectively).

Multiplexers 64 (and pass gate 62) cause the series path of the clock signal from fixed delay stage 14f to either pass through associated delay elements, or pass directly to the next stage without being delayed, responsive to the control input applied thereto from multiplexers $70_3$ through $70_0$, respectively. Each of multiplexers $64_3$, $64_2$, $64_1$, may be constructed as shown in FIG. 3 for multiplexer $64_3$. In this example, the source/drain path of pass gate 66 is connected between the incoming clock signal and the input to the next stage, while pass gate 68 has its source/drain path connected between the output of the final delay element 60 and the input to the next stage. Pass gates 66, 68 in each multiplexer 64 are gated in complementary fashion by the control signal from its associated multiplexer 70, via inverters 65, 67, so that one is on while the other is off. As such, the output of multiplexer 70 will control whether the delayed version or the non-delayed version of the incoming clock signal from fixed delay stage 14f (or from the prior multiplexer 64) is applied to the input of the next stage in variable delay stage 14ν. The least significant delay stage of capacitor 61 is selected by the combination of a pass gate 62 having its source/drain path connected between capacitor 61 and line CLKDELAY, and having its gates controlled in complementary fashion by the output of multiplexer $70_0$.

Multiplexers 70 select between the value of a test signal input on an associated select line 15 or a default value, in communicating to multiplexer 64 (or pass gate 62) whether or not its associated delay value is to be included; multiplexers 70 are controlled by a signal indicating whether or not test mode is enabled. A default value is presented to each of multiplexers 70 by way of an associated weak inverter 77 having both its input and its output tied to a fixed voltage. For example, FIG. 3 shows the inputs and outputs of each inverter 77 tied to $V_{cc}$, in which case inverters 77 will each drive a high voltage at their output. This state of each inverter 77 can be altered by opening the connection between its output and the fixed voltage by way of a metal mask, fuse, laser cut, or the like, allowing inverter 77 to drive its output to the opposite state. In the alternative, the default condition may be set by an electrically programmable element, a register bit, by software, or other conventional techniques.

Each multiplexer 70, in this example, receives a select line 15 at one input, the output of inverter 77 at another input, and the output of NAND gate 72 as the control input. NAND gate 72 receives line 2XEN at one input and line TEST at its other input. The output of NAND gate 72 is connected to the gates of a first pass gate 74 in complementary fashion (via inverter 73), and to the gates of a second pass gate 76 in a manner complementary to its connection to pass gate 74; as such, either pass gate 74 or pass gate 76 will be made conductive, depending upon the state of the output of NAND gate 72. The output of NAND gate 22 is also fed directly to the control input of the next multiplexer 70 in line. With the output of NAND gate 72 low, pass gate 74 will be conductive and connects select line 15 to the control input of multiplexer 64 (or to pass gate 62 in the case of multiplexer $70_0$); a high output from NAND gate 72 will make pass gate 76 conductive, connecting the output of inverter 77 to the control input of multiplexer 64 (or pass gate 62 in the case of multiplexer $70_0$).

In operation, in a non-clock doubling mode (line 2XEN low), the outputs of inverters 77 are selected by all multiplexers 70, presenting the default delay value, preventing metastable or indeterminate conditions in variable delay stage 14ν. In clock doubling mode, the state of line TEST (at the other input of NAND gate 72) will control multiplexers 70. In a non-test mode, or normal operating mode, the output of the array of inverters 77 will determine the delay presented by variable delay stage 14ν, ranging from no delay up to the propagation delay of fifteen inverters, selectable in single inverter (i.e., capacitor 61) increments in binary fashion by the four inverters 77.

In test mode, the state of select lines 15 will determine the delay through variable delay stage 14ν, in a binary fashion by the state of the four select lines $15_j$. Test mode may be enabled by any one of the known techniques in the integrated circuit art, including the provision of a dedicated test mode terminal or pad, an overvoltage condition on one of the normal input terminals to the circuit, a special code executed by circuit 2, or other known techniques. With line TEST high, pass gates 74 in multiplexers 70 will all be on, allowing the state of select lines 15 to determine the variable delay length. Accordingly, in this mode, one may operate circuit 2 with varying delay times $\delta_{14}$ to determine the shortest delay time $\delta_{14}$, and thus the minimum clock phase duration ($t_h$) for which circuit 2 can still successfully operate under a given voltage or temperature condition.

It is contemplated that the provision of variable delay stage 14ν, and its use during a test mode, will be of benefit primarily to the production and design engineers of a particular integrated circuit 2. This is because initial prototype samples may be characterized in test mode to determine a minimum, yet safe, delay time $\delta_{14}$ for varying operating conditions and functions, thus allowing selection of the proper default value by opening the appropriate lines at the output of inverters 77 in variable delay stage 14ν. Furthermore, the use of the test mode can allow for periodic measurement of the minimum delay time $\delta_{14}$ as the circuit 2 is being produced, and accordingly for modification of the metallization mask setting the states of inverters 77 over time.

This construction of variable delay stage 14ν may also be used, if desired, to individually set the state of inverter 77 for each functional circuit, for example by opening a polysilicon fuse at the output of each inverter 77 by way of a laser or an avalanche condition. Further in the alternative, the manufacturer of the circuit may be able to select the proper metal mask in process, based upon threshold voltages, channel lengths and other measurable parameters during the fabrication of circuit 2. Of course, multiplexers 70 may further alternatively be responsive to a register location, such that the propagation delay through variable delay stage 14ν can be set by software.

As a result of the preferred embodiment of the invention, therefore, the duration of the worst case clock phase depends upon a fixed value, closely matching variations in voltage, temperature and processing, plus a variable amount that can be readily selected. Accordingly, the present invention provides for the generation of a high frequency (twice the bus clock frequency) internal clock generated from an external input clock signal which may have unstable duty cycle, and also the ability to tune and select the duty cycle of the internal clock so as to match variations in temperature and processing conditions. In particular, the internal clock so generated can be sufficiently stable relative to changes in the power supply voltages so as to enable the design and manufacture of high speed, high complexity logic circuits such as microprocessors, math co-processors and the like that can operate both at conventional (5 volt) power supply voltages as well as at low (3.3 volt) power supply voltages.

The above-described embodiment of the invention is directed to the internal clock distribution system which generates a half-frequency clock for bus interface operations (line BUSCLK) and a high speed clock for core unit operations (line CORECLK) that is at the same frequency as the input clock signal. Of course, by including conventional frequency multipliers and other frequency synthesizer circuits, one may generate internal clock signals of higher or lower frequencies than that of the input clock signal. It is contemplated that one of ordinary skill in the art, having reference to this specification and the drawings, will be readily able to utilize the benefits of the present invention in such applications.

Figure 5:
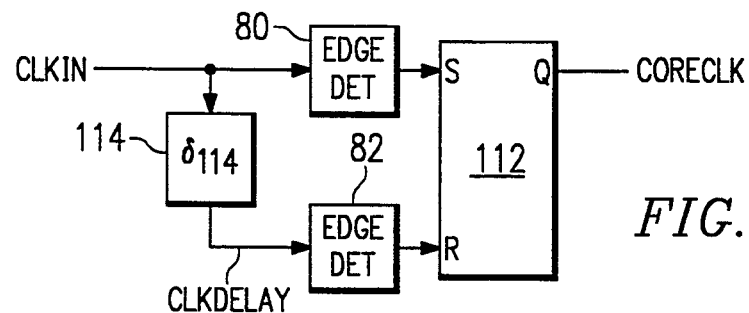
FIG. 5 is an electrical diagram, in block form, of a clock generator circuit according to a first alternative embodiment of the invention.

Referring now to FIG. 5, an exemplary embodiment of the invention is illustrated in block form in which an internal clock signal is generated on line CORECLK at twice the frequency of the input clock signal. In this embodiment, the input clock signal on line CLKIN is communicated to edge detector circuit 80, which generates a rising edge at its output to the set input of clock generator 112 responsive to either a rising or falling edge on line CLKIN. Line CLKIN is also connected to programmable delay stage 114, constructed similarly as programmable delay stage 14 described hereinabove. The output of programmable delay stage 114 on line CLKDELAY is connected to edge detector 82, which detects either a rising or falling edge at its input and generates a rising edge at its output responsive to either a rising or falling edge on line CLKDELAY. The output of edge detector 82 is connected to the reset input of clock generator 112. Clock generator 112 is constructed similarly as clock generator circuit 12 described hereinabove.

In operation, each transition of the input clock signal on line CLKIN is detected by edge detector 80, which applies a pulse at the set input of clock generator 112 and, in this case, drives high the Q output of clock generator 112 at line CORECLK. After elapse of the delay period $\delta_{114}$, the input clock transition will appear on line CLKDELAY and will be detected by edge detector 82 which, in turn, applies a pulse to the reset input of clock generator circuit 112. The reset signal will drive line CORECLK at the Q output of clock generator circuit 112 to a low logic level. Accordingly, since each transition (rising or falling) causes both a set pulse and a reset pulse to be applied to clock generator 112, the frequency at the output of clock generator 112 will be at twice the frequency of the input clock signal.

Figure 6:
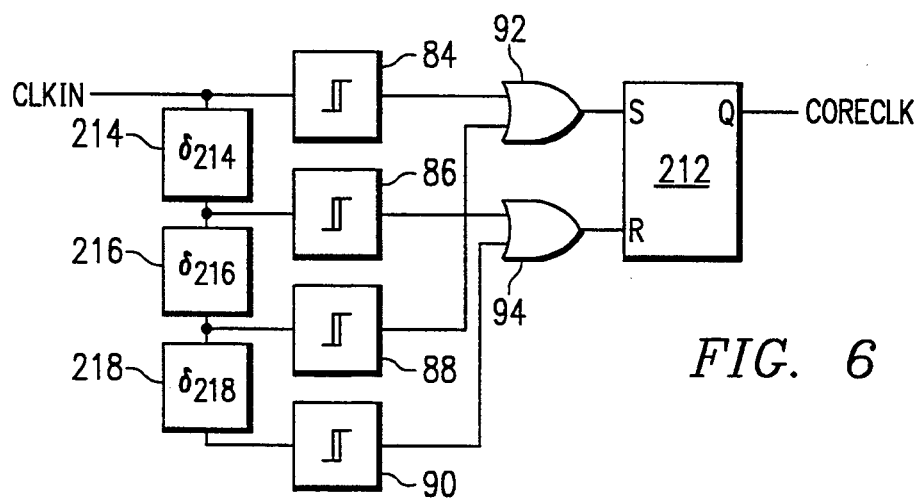
FIG. 6 is an electrical diagram, in block form, of a clock generator circuit according to a second alternative embodiment of the invention.

Referring now to FIG. 6, the construction of a clock multiplier arrangement according to another alternative embodiment of the invention will now be described. In the arrangement of FIG. 6, the frequency of the clock signal on line CORECLK is again multiplied from that on line CLKIN; in this example, the frequency is doubled. Line CLKIN is received by rising edge detector 84, constructed similarly as NAND gates 34, 36 and delay stage 35 in clock generator 12 shown in FIG. 2, to provide a pulse responsive to a rising edge of the signal on line CLKIN; in contrast to the arrangement of FIG. 5, no pulse is generated by rising edge detector 84 responsive to a falling edge on line CLKIN. The output of rising edge detector 84 is connected to a first input of OR gate 92.

Line CLKIN is also connected to a series of delay stages 214, 216, 218, each of which has a separate delay period (although one or more may have the same delay period, if desired). Delay stages 214, 216, 218 preferably include fixed and variable portions, as described hereinabove relative to programmable delay stage 14. The output of delay stage 214 is connected to rising edge detector 86, which in turn has its output connected to one input of OR gate 94. The output of delay stage 216 is connected to rising edge detector 88, which has its output connected to a second input of OR gate 92. Similarly, the output of delay stage 218 is connected to the input of rising edge detector 90, which has its output connected to a second input of OR gate 94.

OR gate 92 drives the set input of clock generator 212 with its output, while OR gate 94 drives the reset input of clock generator 212 with its output. Clock generator 212 may be constructed similarly as clock generators 12 and 112 described hereinabove. Accordingly, clock generator 12 presents a high logic level at its Q output, on line CORECLK, responsive to a pulse at its set input, and resets its Q output to a low logic level responsive to a pulse at its reset input.

Figure 7:
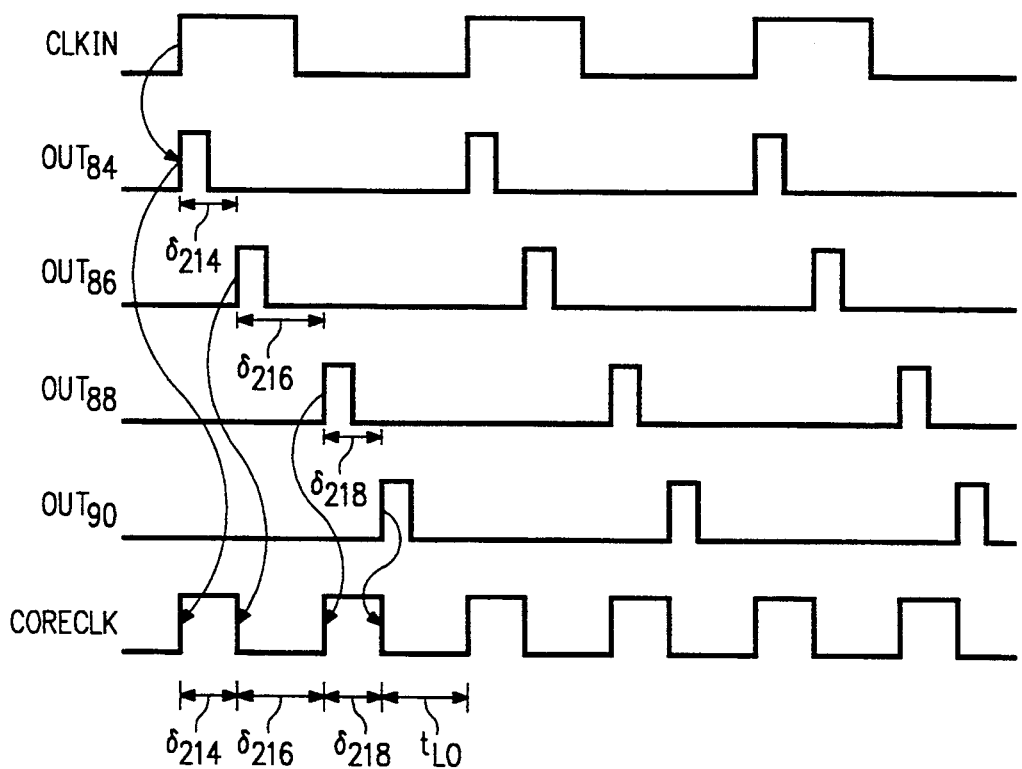
FIG. 7 is a timing diagram illustrating the operation of the circuit of FIG. 6.

According to the embodiment of FIG. 6, therefore, the clock signal on line CORECLK is at twice the frequency of the input clock signal on line CLKIN, with the delay periods $\delta_{214}$, $\delta_{216}$, $\delta_{218}$ determining the duration of three successive phases in two cycles; the fourth phase in the second cycle is determined by the difference between the period of the input clock signal on line CLKIN and the sum of the delay periods $\delta_{214}$, $\delta_{216}$, $\delta_{218}$. Referring now to FIG. 7, the operation of the arrangement of FIG. 6 will now be described. As in the above cases, small propagation delays are not shown, for purposes of clarity.

In FIG. 7, the rising edge of line CLKIN is detected by rising edge detector 84, which presents a high level pulse (OUT$_{84}$ in FIG. 7) to an input of OR gate 92 and thus to the set input of clock generator 212. Accordingly, this rising edge of line CLKIN initiates a rising edge of the clock signal on line CORECLK. After delay period $\delta_{214}$ has elapsed from the rising edge on line CLKIN, a rising edge is presented to rising edge detector 86, which issues a high level (OUT$_{86}$) to OR gate 94 and thus to the reset input of clock generator 212. This pulse from OR gate 94 causes clock generator 212 to reset its Q output. As a result, the high level phase of the first cycle of the clock signal on line CORECLK is determined by the delay period $\delta_{214}$.

The rising edge of line CLKIN ripples next through delay stage 216 which, after delay time $\delta_{216}$, presents a rising edge to rising edge detector 88. A pulse (see OUT$_{88}$) is then presented to OR gate 92, to again cause clock generator 212 to present a high level at its Q output on line CORECLK. Accordingly, the delay time $\delta_{216}$ defines the duration of the low level phase of the first cycle of the clock signal on line CORECLK.

The rising edge next ripples through delay stage 218, causing a rising edge to be presented, after an additional delay time $\delta_{218}$, to rising edge detector 90. Rising edge detector 90 then presents a pulse (see OUT$_{90}$) to OR gate 94, sending a pulse to the reset input of clock generator 212, resetting line CORECLK to a low logic level. Accordingly, the duration of the high level phase of the second cycle of the clock signal on line CORECLK is defined by the delay time $\delta_{218}$.

The Q output of clock generator 212 on line CORECLK remains at a low logic level until the next rising edge of the input clock signal on line CLKIN is received. As such, the delay times $\delta_{214}$, $\delta_{216}$, $\delta_{218}$ must, of course, be selected so that their sum does not exceed the period of the input clock signal, as such a situation would result in an unstable clock on line CORECLK. The duration of the second low phase of the output clock signal on line CORECLK is thus defined by the difference in period in the input clock signal less the sum of the delay times $\delta_{214}$, $\delta_{216}$, $\delta_{218}$; this duration is shown in FIG. 7 as time $t_{LO}$.

The arrangement of FIG. 6 thus provides for stable frequency multiplication, independent of the phase duration or duty cycle of the input clock signal, as the phase durations are defined by the delay times in the clock control circuit. As such, the duty cycle of the input clock may vary without affecting the duty cycle of the output clock signal, particularly since the falling edge of the input clock signal is not used in, and does not affect, the generation of the output clock signal. In addition, the delay times may be selected so that alternating output clock periods can have different phase durations. Furthermore, multiplication of the input clock frequency to other integral multiples (three and up) may be readily implemented, merely by stacking additional delay stages in a similar manner, so long as the sum of the delay times is less than the period of the input clock signal.

The arrangements described hereinabove relative to FIGS. 5 and 6 may, of course, be used in conjunction with frequency divider 10 or such other clock generator or frequency synthesizer circuits as useful in the circuit utilizing the present invention. In addition, these alternative embodiments may also be constructed similarly as described hereinabove relative to FIG. 2 to responds to the state of line 2XEN, or another control signal, so that the clock doubling mode may be selectably enabled or disabled.

The present invention thus provides significant advantages over conventional clock doubling schemes. Firstly, the present invention provides for the generation of an internal clock, at the fundamental frequency of the input clock signal or at multiples thereof, having a phase duration which is independent of the duty cycle of the input clock signal, and in a selectable clock doubling mode so that different clock frequencies are provided to different portions of the circuit. As such, instabilities in the duty cycle of the input clock signal, or noise effects such as ringing and the like, do not significantly affect the internal clock signals, even at high frequencies such as above 25 MHz. Furthermore, the present invention allows for optimization of the phase duration of the internal clock signal according to the worst case logic path within the circuit, so that erroneous operation is avoided even for unstable duty cycle input clocks. In addition, the generation of the optimized phase duration by way of a delay stage may be done in such a manner as to accurately match variations in temperature, voltage, and manufacturing parameters, and in such a manner as to allow characterization and adjustment thereof. It is therefore contemplated that the present invention will greatly facilitate the generation of internal clock signals in high frequency integrated circuits, particularly those that operate over a wide operating power supply voltage range.

While the invention has been described herein relative to its preferred embodiments, it is of course contemplated that modifications of, and alternatives to, these embodiments, such modifications and alternatives obtaining the advantages and benefits of this invention, will be apparent to those of ordinary skill in the art having reference to this specification and its drawings. It is contemplated that such modifications and alternatives are within the scope of this invention as subsequently claimed herein.

We claim:

1. A clock generator circuit for generating, at its output, a first output clock signal responsive to an input clock signal received at its input, comprising:

a first delay stage, having an input connected to the clock generator input and having an output for presenting a delayed input clock signal;

a latch, having an input, and having an output coupled to the clock generator output;

a set circuit, having an input coupled to the clock generator input and having an output coupled to the latch input, for setting the latch responsive to a first transition of said input clock signal; and a reset circuit, having an input coupled to the output of the first delay stage, and having an output coupled to the latch input, for resetting the latch responsive to a first transition of the delayed input clock signal.

2. The clock generator circuit of claim 1, wherein said set circuit comprises:

a set transistor, having a conduction path coupled between the latch input and a first voltage, and having a control terminal coupled to the clock generator input.

3. The clock generator circuit of claim 2, wherein said reset circuit comprises:

a reset transistor, having a conduction path coupled between the latch input and a second voltage, and having a control terminal coupled to the output of the first delay stage.

4. The clock generator circuit of claim 3, wherein said set circuit further comprises:

a set pulse generator, having an input coupled to the clock generator input and having an output coupled to the control terminal of the set transistor, for generating a pulse responsive to a first transition of said input clock signal, said pulse having a polarity operable to turn on said set transistor;

and wherein said reset circuit further comprises:

a reset pulse generator, having an input coupled to the output of the first delay stage and having an output coupled to the control terminal of the reset transistor, for generating a pulse responsive to a first transition of said delayed input clock signal, said pulse having a polarity operable to turn on said reset transistor.

5. The clock generator circuit of claim 1, wherein said first transition of said input clock signal is a low-to-high transition;

wherein said set circuit sets the latch responsive to either a low-to-high transition or a high-to-low transition of said input clock signal;

and wherein said reset circuit resets the latch responsive to either a low-to-high transition or a high-to-low transition of said delayed input clock signal.

6. The clock generator circuit of claim 1, further comprising:
a second delay stage, having an input connected to the output of the first delay stage, having an output coupled to said set circuit; and
a third delay stage, having an input connected to the output of the second delay stage, having an output coupled to said reset circuit;
wherein said set circuit comprises circuitry for detecting the first transition at said clock input and the first transition at the output of said second delay stage, and for setting said latch responsive thereto;
and wherein said reset circuit comprises circuitry for detecting the first transition at the output of said first delay stage and the first transition at the output of said third delay stage, and for resetting said latch responsive thereto.

7. The clock generator circuit of claim 1, further comprising:
a frequency divider, coupled to said clock generator input, for generating a second output clock signal responsive to said input clock signal, said second output clock signal being at a different frequency from that of said input clock signal.

8. The clock generator circuit of claim 1, wherein said delay stage comprises a plurality of logic elements, each corresponding to a different logic function.

9. The clock generator circuit of claim 1, wherein said delay stage comprises:
a fixed delay stage; and
a variable delay stage, connected in series with said fixed delay stage, and comprising:
a plurality of delay elements; and
a select circuit for selecting among said plurality of delay elements to set the propagation delay of said variable delay stage.

10. The clock generator circuit of claim 9, wherein said fixed delay stage comprises a plurality of logic elements, each corresponding to a different logic function.

11. The clock generator circuit of claim 9, wherein said variable delay stage further comprises:
a plurality of programmable elements, coupled to the select circuit of said variable delay stage and associated with each of said plurality of delay elements, each programmable element indicating whether or not its associated delay element is to be connected in series in said variable delay stage.

12. The clock generator circuit of claim 11, wherein said programmable elements are mask programmable.

13. The clock generator circuit of claim 11, further comprising:
a plurality of multiplexers, each having a first input coupled to an associated programmable element, each having a second input coupled to an associated select line, and each having a control input coupled to a test mode input, for selecting, responsive to said test mode input, either its associated select line or its associated programmable element for determining whether or not its associated delay element is to be connected in series in said variable delay stage.

14. The clock generator circuit of claim 9, wherein said plurality of delay elements have propagation delays which vary with powers of two relative to one another.

15. An integrated circuit, comprising:
first and second functional modules, each having an associated clock input; and
a clock generator circuit for generating first and second output clock signals to said first and second functional modules responsive to an input clock signal received at its input, said clock generator circuit comprising:
a first delay stage, having an input connected to the clock generator input and having an output for presenting a first delayed input clock signal;
a latch, having an input, and having an output coupled to the clock input of said first functional module for presenting said first output clock signal thereat;
a set circuit, having an input coupled to the clock generator input and having an output coupled to the latch input, for setting the latch responsive to a first transition of said input clock signal;
a reset circuit, having an input coupled to the output of the first delay stage, and having an output coupled to the latch input, for resetting the latch responsive to a first transition of the first delayed input clock signal; and
a frequency divider, having an input coupled to said clock generator input and having an output coupled to the clock input of said second functional module, for presenting thereat said second output clock signal at a different frequency from that of said input clock signal.

16. The integrated circuit of claim 15, wherein said set circuit comprises:
a set transistor, having a conduction path coupled between the latch input and a first voltage, and having a control terminal coupled to the clock generator input; and
a set pulse generator, having an input coupled to the clock generator input and having an output coupled to the control terminal of the set transistor, for generating a pulse responsive to a first transition of said input clock signal, said pulse having a polarity operable to turn on said set transistor;
and wherein said reset circuit comprises:
a reset transistor, having a conduction path coupled between the latch input and a second voltage, and having a control terminal coupled to the output of the first delay stage; and
a reset pulse generator, having an input coupled to the output of the first delay stage and having an output coupled to the control terminal of the reset transistor, for generating a pulse responsive to a first transition of said first delayed input clock signal, said pulse having a polarity operable to turn on said reset transistor.

17. The integrated circuit of claim 15, wherein said first transition of said input clock signal is a low-to-high transition;
wherein said set circuit sets the latch responsive to either a low-to-high transition or a high-to-low transition of said input clock signal;
and wherein said reset circuit resets the latch responsive to either a low-to-high transition or a high-tolow transition of said first delayed input clock signal.

18. The integrated circuit of claim 15, wherein said clock generator circuit further comprises:
a second delay stage, having an input connected to the output of the first delay stage, and having an output for presenting a second delayed input clock signal; and
a third delay stage, having an input connected to the output of the second delay stage, having an output for presenting a third delayed input clock signal;
wherein said set circuit comprises circuitry for setting said latch responsive to either the first transition of said input clock signal or the first transition said second delayed input clock signal;
and wherein said reset circuit comprises circuitry for resetting said latch responsive to either the first transition of the first delayed input clock signal or the first transition of the third delayed input clock signal.

19. The integrated circuit of claim 15, wherein said first delay stage comprises:
a fixed delay stage; and
a variable delay stage, connected in series with said fixed delay stage, and comprising:
a plurality of delay elements; and
a select circuit for selecting among said plurality of delay elements to set the propagation delay of said variable delay stage.

20. The integrated circuit of claim 19, wherein said fixed delay stage comprises a plurality of logic elements, each corresponding to a different logic function.

21. The integrated circuit of claim 19, wherein said variable delay stage further comprises:
a plurality of programmable elements, coupled to the select circuit of said variable delay stage and associated with each of said plurality of delay elements, each programmable element indicating whether or not its associated delay element is to be connected in series in said variable delay stage.

22. The integrated circuit of claim 21, wherein said programmable elements are mask programmable.

23. The integrated circuit of claim 21, further comprising:
a plurality of multiplexers, each having a first input coupled to an associated programmable element, each having a second input coupled to an associated select line, and each having a control input coupled to a test mode input, for selecting, responsive to said test mode input, either its associated select line or its associated programmable element for determining whether or not its associated delay element is to be connected in series in said variable delay stage.

24. The integrated circuit of claim 19, wherein said plurality of delay elements have propagation delays which vary with powers of two relative to one another.

25. A method for generating an internal clock signal in an integrated circuit responsive to an input clock signal, comprising the steps of:
setting a latch to a first state responsive to a first transition of said input clock signal, the output of said latch coupled to present said internal clock signal;
applying said input clock signal to a first delay stage to generate a first delayed input clock signal;
resetting said latch responsive to a first transition of said first delayed input clock signal.

26. The method of claim 25, wherein said first transition corresponds to a low-to-high transition;
wherein said setting step is performed responsive to either a low-to-high or a high-to-low transition of said input clock signal;
and wherein said resetting step is performed responsive to either a low-to-high or a high-to-low transition of said first delayed input clock signal.

27. The method of claim 26, further comprising:
selecting the duration of said delaying step.

28. The method of claim 27, wherein said selecting step comprises:
operating said integrated circuit a plurality of times at varying delay durations; and
selecting said duration based on the results of said operating step.

29. The method of claim 28, further comprising:
during said operating step, varying said delay durations by applying varying binary signals to a programmable delay stage, said varying binary signals operable to select varying delay durations.

30. The method of claim 25, further comprising:
applying said first delayed input clock signal to a second delay stage to generate a second delayed input clock signal;
setting said latch to the first state responsive to a first transition of said second delayed input clock signal;
applying said second delayed input clock signal to a third delay stage to generate a third delayed input clock signal; and
resetting said latch to the second state responsive to a first transition of said third delayed input clock signal.

* * * * *